United States Patent [19]

Su

[11] Patent Number: 5,032,010
[45] Date of Patent: * Jul. 16, 1991

[54] OPTICAL SERIAL-TO-PARALLEL CONVERTER

[75] Inventor: Shing-Fong Su, Southboro, Mass.

[73] Assignee: GTE Laboratories Incorporated, Waltham, Mass.

[*] Notice: The portion of the term of this patent subsequent to May 8, 2007 has been disclaimed.

[21] Appl. No.: 286,592

[22] Filed: Dec. 19, 1988

[51] Int. Cl.$^5$ .................... G02B 6/28; G11C 17/00; G11C 5/06; G06F 7/56

[52] U.S. Cl. .................... 350/354; 350/356; 350/96.16; 364/713; 364/822; 364/824; 370/1; 377/64; 377/70

[58] Field of Search .............. 350/96.13, 96.14, 96.15, 350/96.16, 355, 356, 354; 377/64, 70, 73; 370/1, 3; 364/713, 822, 824

[56] References Cited

U.S. PATENT DOCUMENTS 4,620,180 10/1986 Carlton .................... 377/64
4,761,060 8/1988 Sawano .................... 350/354

FOREIGN PATENT DOCUMENTS 0115299 6/1986 Japan .................... 377/64

OTHER PUBLICATIONS

"An Ultrafast All-Optical Switch", Friberg et al., Springer Series in Electronics 25, Photonic Switching, 1988 pp. 92-94.
R. A. Thompson and P. P. Giordano, "An Experimental Photonic Time Slot Interchanger Using Optical Fibers as Reentrant Delay Line Memories," J. Lightwave Technology, vol. LT-5 pp. 154-162, Jan. 1987.
H. Goto, "Photonic Time-Division Switching Technology, Technology Digest", Topical Meeeting on Photonic Switching, pp. 132-134, Mar. 1987.

Primary Examiner—Eugene R. LaRoche
Assistant Examiner—Michael Shingleton
Attorney, Agent, or Firm—Victor F. Lohmann, III; James J. Cannon, Jr.

[57] ABSTRACT

An optical serial-to-parallel converter constructed from at least two optical shift registers connected in cascade, each optical shift register having a 1×2 optical switch connected to its output. Each optical shift register in the sequence is optically coupled to the next sequential optical shift register through one output of said 1×2 optical switch to the input port of the next sequential optical shift register. The input port of the first optical shift register serves as the input to the optical serial-to-parallel converter, receiving a series of optical pulses. The output ports of each of said third optical switches serve as the output ports of the optical serial-to-parallel converter. The optical shift registers are controlled by two clocks, operating at the same rate, but each out of phase with the other. Control signals are provided by a third clock to output said optical pulses simultaneously from said optical shift registers through said optical output switches to effect an optical serial-to-parallel conversion.

2 Claims, 1 Drawing Sheet

1

OPTICAL SERIAL-TO-PARALLEL CONVERTER

BACKGROUND OF THE INVENTION

This invention relates to optical components generally, that is, components which operate in the optical domain. Such components are designed for use in various systems which utilize optical fibers, such as optical communications systems, optical data processing systems and optical switching systems. Specifically, this invention pertains to an optical serial-to-parallel converter.

The development of optical fiber and optical semiconductor technologies in recent years has made possible various types of optical communications systems and optical switching systems. To utilize the full bandwidth and speed available in optical systems, it has become necessary to design and fabricate optical logic and switching components which eliminate the necessity for electrical-to-optical and optical-to-electrical conversions.

Electronic serial-to-parallel converters have played a major role in digital electronic systems for many decades. Numerous electronic systems and subsystems have been based on them. Optical serial-to-parallel converters, on the contrary, were relatively neglected because there were few optical systems that really needed serial-to-parallel converters. This is no longer true. The deployment of optical fibers for information transmission has necessitated a different approach to this problem. At present, the high bandwidth advantage of optical fibers is still not fully utilized because electronic switching systems are not fast enough for high speed and high throughput optical switching. To solve this problem, the switching functions must be performed in the optical domain, eliminating the optical-to-electrical and electrical-to-optical conversions. Despite the rapid development of optical fiber technology, optical serial-to-parallel converters have received only scant attention. It is presently anticipated that optical serial-to-parallel converters will play an important role in optical switching systems such as self-routing optical switching systems and optical ring switching systems. In these switching systems, the use of optical serial-to-parallel converters will simplify the design of the systems and improve their performance.

In existing optical time-division switching systems, time slot interchanges are accomplished by using the demultiplexing/storing/retrieving/multiplexing procedure. Examples may be found in R. A. Thompson and P. P. Giordano, "An experimental photonic time-slot interchanger using optical fibers as reentrant delay-line memories," J. Lightwave Technology, vol. LT-5, pp. 154–162, January 1987, and H. Goto, "Photonic time-division switching technology," Technical Digest, Topical Meeting on Photonic Switching, pp. 132–134, March 1987. In this prior art optical writing gates and bistable devices are employed for demultiplexing and storing, respectively. These two types of devices may be replaced by an optical serial-to-parallel converter which performs the same functions.

SUMMARY OF THE INVENTION

The principal object of the present invention is to provide an optical serial-to-parallel converter in which serial optical pulses are converted to parallel optical pulses without optical-to-electrical or electrical-to-optical conversion.

Another object of the invention is to provide an optical serial-to-parallel converter in which adjacent optical pulses are well isolated, causing no crosstalk among time slots.

Still another object of the present invention is to provide an optical serial-to-parallel converter which is simple in both structure and operation, but which has none of the shortcomings of prior combinations of optical devices or electronic equivalents when used in optical systems.

A further object of the invention is to provide an optical serial-to-parallel converter in which the speed of the optical serial-to-parallel converter may be adjusted according to the incoming optical data rate.

Still a further object of the invention is to provide an optical serial-to-parallel converter for which the control timing is simple.

Another object of the invention is to provide an optical serial-to-parallel converter which can be implemented using integrated optics technology.

This invention is an optical serial-to-parallel converter having a single input to receive serially a set of optical pulses and a plurality of outputs to present said set of optical pulses simultaneously at its output. Said optical serial-to-parallel converter is constructed from a plurality of cascaded optical single bit shift registers and 1×2 optical switches. In one aspect of the invention, a two-bit optical serial-to-parallel converter consists of two cascaded single bit optical shift registers and two 1×2 optical output switches. Each single bit optical shift register, in turn, consists of two cascaded optical memory cells, each memory cell having a 1×2 optical switch, a passive optical combiner, delay line fibers and an optical amplifier. The two optical switches in the single bit optical shift registers are controlled by a first clock and a second clock, running at the same rate, but out of phase with each other. When the first clock controlling both single bit optical shift registers is low, one optical pulse can enter the optical converter through its input and into the first optical memory cell. When the first clock switches to high and the second clock to low, the remaining optical pulses are shifted to the next optical memory cell. When the clocks again change to first clock low and second clock high, the optical pulse can exit the first single bit optical shift register or be switched to an output of the optical converter. This enter-shift-exit cycle repeats at the rate of the first and second clocks, until each single bit optical shift register in the optical converter contains one optical pulse. Each of the two single bit optical shift registers is connected to an optical switch, controlled by a third clock, at its output. In the straight-through state of the output optical switch the ouput of the first optical shift register is passes onto the next optical shift register. The clock at the output optical switch operates at the rate of the optical shift register clocks divided by the number of bits in the optical converter. As serial optical pulses enter the optical converter, they are shifted from the first optical shift register to the next until all optical shift registers are full. At this point, the optical output switches change to high and all optical pulses in the optical converter appear on its output simultaneously.

In a second aspect of the invention, a multibit optical serial-to-parallel converter is constructed by cascading a larger number of single bit optical shift registers together. For an N bit optical word to be converted from serial-to-parallel optical pulses, N optical shift registers are required, having N output optical switches controlled by N clocks operating at the clock rate of the optical shift register clocks divided by N. There is no change in the operational principles.

The above and other objects, features and advantages of this invention are illustrated in the following detailed description, in which reference is made to the accompanying drawings.

DESCRIPTION OF THE PREFERRED EMBODIMENTS

Figure 1:
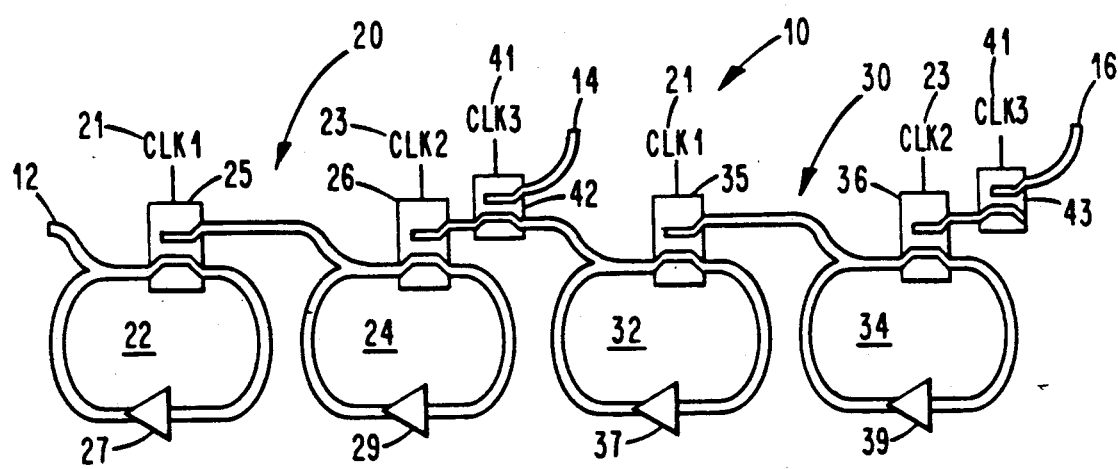
FIG. 1 is a diagrammatic illustration of the preferred embodiment of a three-bit optical serial-to-parallel converter according to the present invention.

FIG. 1 is a diagrammatic illustration of the preferred embodiment of a two-bit optical serial-to-parallel converter 10 constructed in accordance with the principles of the present invention. Two-bit optical serial-to-parallel converter 10 has a single input 12 to receive serially a set of two optical pulses and two output ports 14, 16 to output said optical pulses simultaneously in parallel. Two-bit optical converter 10 consists of two cascaded single bit optical shift registers 20, 30 each single bit optical shift register combining two cascaded single bit optical memory cells 22, 24, 32, 34. The optical memory cell described and illustrated herein has been disclosed in a copending U.S. patent application entitled OPTICAL MEMORY CELL, Ser. No. 280,396, filed Dec. 5, 1988 by the inventor of this application and assigned to the same assignee as this application. The optical shift register described and illustrated herein has been disclosed in a copending U.S. patent application entitled OPTICAL SHIFT REGISTER, Ser. No. 280,045 filed Dec. 5, 1988 by the inventor of this application and assigned to the same assignee as this application. These two related applications are incorporated herein by reference, and specifically the drawings and the descriptions of the preferred embodiments are incorporated herein by reference with respect to the structure and operation of said single bit optical memory cell and of said single bit optical shift register. Optical memory cells 22, 32, are controlled by a first clock 21, while optical memory cells 24, 34 are controlled by a second clock 23, and said memory cells include $1 \times 2$ optical switches 25, 26, 35, 36 and optional optical amplifiers 27, 29, 37, 39. Single bit optical shift registers 20, 30 are cascaded to form optical converter 10 by adding to each a third optical output switch 42, 43 controlled by a third clock 41. Each output optical switch 42, 43 is connected to the output of its respective optical shift register in optical converter 10. The cross-over outputs of optical switches 42, 43 constitute the output ports 14, 16 of optical converter 10.

Figure 2:
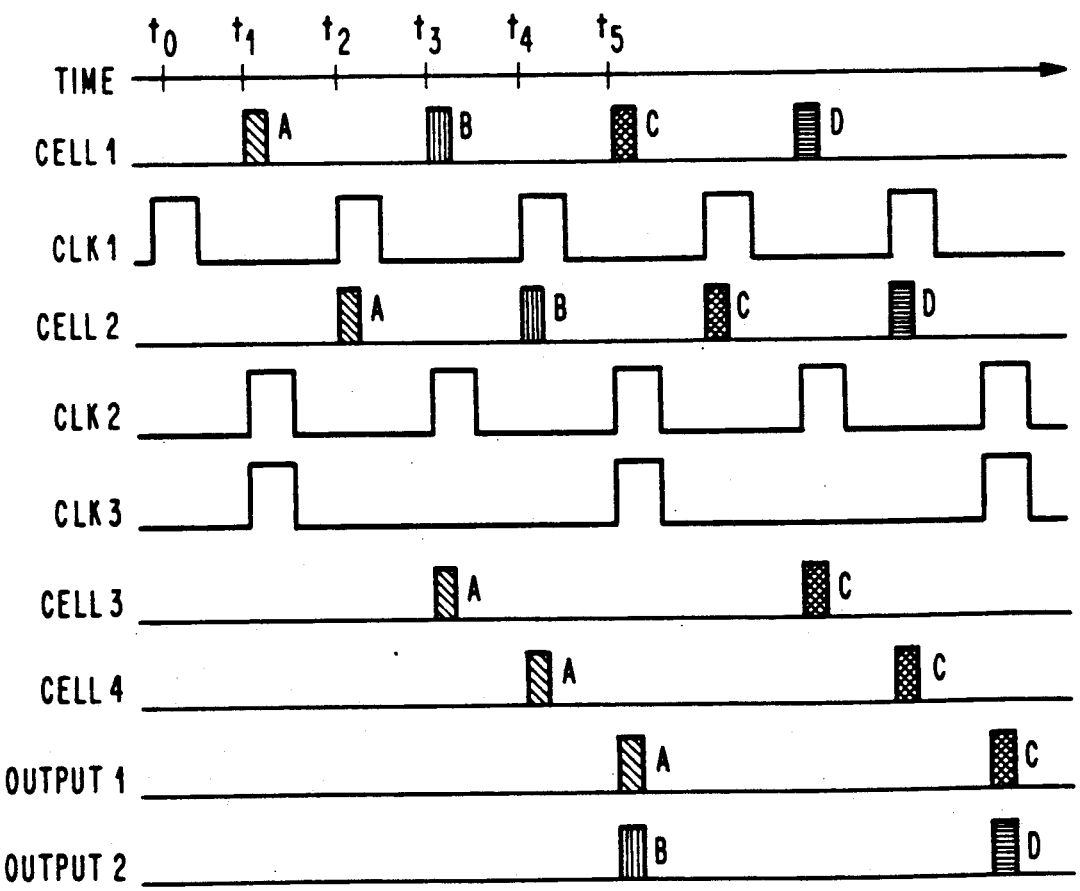
FIG. 2 is a timing control diagram of the three-bit optical serial-to-parallel converter of FIG. 1.

All of the optical switches are in the cross-over state when their controlling clocks are high. They are in the straight-through state when their controlling clocks are low. These clocks may be optical or electrical, depending on the types of optical switches used. If the optical switches are $LiNbO_3$-based directional couplers or cross-couplers, the clocks are electrical. If the optical switches are pure optical switches, then the clocks are optical. As shown in FIG. 2, clocks 21 and 23 run at the same rate, but out of phase with each other. The rate of clock 41 is given by the rate of clock 23 divided by N, where N is the number of bits or optical pulses in optical converter 10. In the example described and herein illustrated in FIG. 2, clock 41 runs at one-half the rate of clock 23 for a two-bit optical converter. The duty cycles of all clocks in optical converter 10 are less than fifty per cent. This prevents adjacent optical pulses from being mixed together. The optical amplifiers 27, 29, 37, 39 are used to compensate for the optical losses caused by the various optical components in optical converter 10. These optical amplifiers could be discrete components or distributed optical fiber amplifiers.

To elucidate the operation of the two-bit optical serial-to-parallel converter 10, we assume that it is empty at the beginning. At time $t=t_0$, clock 21 is high, clocks 23 and 41 are low, optical switches 25, 35 are in the cross-over state and the other optical switches are in the straight-through state. The optical serial-to-parallel converter 10 is empty at this moment. At $t=t_1$ clock 21 is low, switch 25 is in the straight-through state, and an optical pulse A enters memory cell 22 through input port 12. At $t=t_2$, clock 21 is high, clock 23 is low, switch 25 is in the cross-over state, and optical pulse A shifts to memory cell 24. At $t=t_3$, clock 21 and clock 41 are low, clock 23 is high, switch 42 is in the straight-through state, and optical pulse A shifts from memory cell 24 in shift register 20 to memory cell 32 in shift register 30 through optical switch 42 under the control of clock 41. At the same time, optical pulse B enters converter 10 through input 12 to memory cell 22. At $t=t_4$, optical pulse A shifts to memory cell 34 and optical pulse B shifts to memory cell 24. At $t=t_5$, optical pulses A and B exit from outputs 14 and 16 respectively via optical switches 42, 43 under the control of clock 41. At the same time, optical pulse C enters memory cell 22 through input port 12. Thus, two serial bits A and B are converted to parallel bits and the next conversion cycle begins. The conversion cycle repeats at the rate of clock 41. It should be pointed out that receiving an optical pulse at input port 12 and outputting optical pulses at output ports 14, 16 need not occur at exactly the same time. Memory cell 22 may accept an optical pulse through input port 12 at any time so long as clock 21 is low and stays low long enough for the entire optical pulse to get into memory cell 22. The shifts from memory cell 22 to memory cell 24 and from memory cell 32 to memory cell 34 are synchronous with clock 21, since they are controlled by clock 21. Similarly, the shift from memory cell 24 to memory cell 32 is synchronous with clock 23, and optical pulse outputting through optical output switches 42, 43 is synchronous with clock 41. The clock rates are adjustable so that the rate of clock 21 can accommodate various input data ranges. Practically, clock 21 should always run synchronously with the incoming data rate.

While FIG. 1 shows only a two-bit optical serial-to-parallel converter, it should be obvious to one skilled in the art to extend the bit length of two-bit optical serial-to-parallel converter 10. Multi-bit optical serial-to-parallel converters can be constructed by cascading a number of single bit optical shift registers together. The principles of operation do not change at all. For N serial bits or optical pulses to be converted to parallel bits or optical pulses, N single bit optical shift registers and N output optical switches are required. Only three clocks are required, two for the single bit optical shift registers and one for the optical output switches. The output clock needs a clock rate equal to the single bit optical shift register clock rate divided by N.

A variety of 1×2 optical switches may be used in optical serial-to-parallel converter 10 and its component optical memory cells. At the present time, electro-optic switches, such as LiNbO$_3$-based directional couplers and cross-couplers, are good candidates for this application because their technologies are relatively mature compared with those of pure optical switching elements. A pure optical switching element, such as a nonlinear optical coupler, as described in Friberg et al., "An ultrafast all-optical switch," Photonic Switching, Springer Series in Electronics and Photonics 25, pp. 92-94, 1988, will be a better element to use when it becomes available and practical.

The concept, structure and operational principle of the optical serial-to-parallel converter described herein are independent of the technology used to implement it. The optical serial-to-parallel converter 10 of the present invention can be implemented not only using discrete components, as shown in FIG. 1, but also using integrated optics technology, or other advanced technologies.

A variety of photonic systems, subsystems and/or components can be implemented which are based on and/or utilize the optical serial-to-parallel converter of the present invention, such as optical time slot interchangers. The optical serial-to-parallel converter is a needed building block for photonic switching. It enables a variety of optical switching architectures which were not considered feasible before. For example, in existing optical time-division switching architectures, the time slot interchanges are accomplished by using the demultiplexing/storing/retrieving/multiplexing procedure, as discussed supra in the Background of the Invention. New optical switching architectures equipped with optical serial-to-parallel converters will no longer need the demultiplexing process.

The novel optical serial-to-parallel converter of the present invention offers many features and advantages over prior art devices, most of which were not optical devices. Serial optical pulses are converted to parallel optical pulses without optical-to-electrical or electrical-to-optical conversion. The adjacent optical pulses are well isolated, causing no crosstalk among time slots. This optical serial-to-parallel converter can be implemented using integrated optics technology, principally because the physical length of the optic fiber is short. The speed of the optical serial-to-parallel converter may be adjusted according to the incoming optical data rate. And timing control of this novel optical serial-to-parallel converter is relatively easy and simple.

What is claimed is:

1. An optical serial-to-parallel converter, comprising:
   optical input means adapted to serially receive sets of N optical pulses;
   optical storage means comprising:
      N single bit optical shift registers, each of said optical shift registers having an input port adapted to receive optical pulses and an output port adapted to output optical pulses responsive to control signals;
      means to optically couple said N optical shift registers in cascade such that the output port of one optical shift register is optically coupled to the input port of the next sequential optical shift register in said cascade;
      each of said single bit optical shift registers having means to optically store a circulating optical pulse and optically shift a single optical pulse responsive to control signals; and
      means to load and shift each of a set of N serial optical pulses received at the input of said optical converter into said cascaded optical shift registers until each of said N optical shift registers has stored one of said N optical pulses;
   said optical storage means optically being coupled to said optical input means and adapted to store temporarily each of said N optical pulses of a set as it is received until all N pulses of said set have been received;
   N optical output means optically coupled to said optical storage means adapted to output simultaneously and in parallel all of said N optical pulses as soon as the last of said optical pulses has been received and stored temporarily, each of said N optical output means outputting one of said optical pulses; and
   control means adapted to provide signals to control the input, storage and output of said optical pulses.

2. The optical serial-to-parallel converter of claim 1, wherein each said N optical output means comprises:
   an optical switching means having an input end adapted to receive optical pulses, a first output end and a second output end, and a control means, said optical switching means being adapted to switchably couple optical pulses from said input end to said output ends responsive to control signals from said control means; and
   each of said N optical switching means being optically coupled to said output port of one of said N optical shift registers.

3. The optical serial-to-parallel converter of claim 2 wherein said means to optically couple each of said N optical shift registers in cascade comprises:
   optically coupling said input end of one of said optical switching means to said output port of a first of said optical shift registers and optically coupling a first output end of said switching means to said input end of the next sequential optical shift register in said sequence; and
   said second output of each of said optical switching means being the output port for one of said N optical pulses of said optical serial-to-parallel converter.

4. The optical serial-to-parallel converter of claim 1 wherein said control means comprises:
   first and second clock means to provide control signals to each of said optical shift registers;
   each of said optical shift registers having the same first and second clock means operating at the same clock rate, but said first and second clock means being out of phase with each other;
   said first and second clock means controlling the entry of an optical pulse to each of said optical shift registers and the exit of said optical pulse from each of said optical shift registers; and
   a third clock means controlling the output of each of said optical output switching means, thereby controlling the output of said serial-to-parallel converter;
   whereby the conversion of a series of optical pulses to a set of parallel optical pulses results from the simultaneous exit of said optical pulses from said optical shift registers under the control of said third clock means.

5. The optical serial-to-parallel converter of claim 1 wherein each of said single bit optical shift registers comprises:
   at least two optical memory cells, each of said optical memory cells having an input port and an output port;
   means to optically couple said optical memory cells in cascade;
   each of said optical memory cells having clock means operating at the same clock rate, but each clock means being out of phase with said clock means in the next sequential optical memory cell;
   said clock means controlling the entry of an optical pulse to each of said optical memory cells and the exit of said optical pulse from each of a said optical memory cells;
   whereby the shifting of an optical pulse results from its exit from a first optical memory cell and its entry into the next sequential optical memory cell.

6. The optical serial to parallel converter of claim 5, wherein each of said optical memory cells comprises:
   an optical switch means having an input end adapted to receive an optical pulse, a first output end, a switch second output end and a control means, said switch control means being adapted to switchably couple an optical pulse from said first input end to said first output end in its straight-through state and to switchably couple an optical pulse from said input end to said second output end in its crossover state, responsive to control signals applied to said switch control means;
   an optical combiner having first and second input ends and an output end adapted to receive an optical pulse on either input end and output said optical pulse on said output end;
   an optical fiber connecting said output end of said optical combiner to said input end of said optical switch;
   an optical fiber connecting said first output end of said optical switch to said second input end of said optical combiner;
   such that said optical switch in its straight-through state, said optical combiner and said optical fibers form an optical loop capable of storing a circulating optical pulse;
   said first input end of said optical combiner serving as an input means to said optical loop;
   said second output end of said optical switch serving as an output means from said optical loop when said optical switch is in its cross-over state; and
   control switch means to control the input of an optical pulse to said memory cell and the output of said pulse from said cell.

7. The optical serial-to-parallel converter of claim 6, further comprising:
   an optical amplifier positioned within said loop to compensate for optical losses incurred by an optical pulse circulating within said loop.

8. The optical serial-to-parallel converter of claim 6, wherein said optical switch means is an electro-optical switch.

9. The optical serial-to-parallel converter of claim 6, wherein said optical switch means is a directional coupler.

10. The optical serial-to-parallel converter of claim 6, wherein said optical switch means is a cross-coupler.

11. The optical serial-to-parallel converter of claim 6, wherein said optical switch means is a nonlinear optical coupler.

12. The optical serial-to-parallel converter of claim 6, wherein said optical combiner is a fiber coupler.

13. The optical serial-to-parallel converter of claim 6, wherein said optical combiner is a waveguide coupler.

* * * * *